(12) United States Patent
Mu

(10) Patent No.: US 10,407,768 B2
(45) Date of Patent: Sep. 10, 2019

(54) CLAMP AND CARRIER USED IN A COATING APPARATUS

(71) Applicants: BOE TECHNOLOGY GROUP CO., LTD., Beijing (CN); Hefei BOE Optoelectronics Technology Co., Ltd., Hefei, Anhui (CN)

(72) Inventor: Huihui Mu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 348 days.

(21) Appl. No.: 15/093,034

(22) Filed: Apr. 7, 2016

(65) Prior Publication Data

US 2016/0343555 A1    Nov. 24, 2016

(30) Foreign Application Priority Data

May 18, 2015  (CN) .......................... 2015 1 0254289

(51) Int. Cl.
*C23C 14/50*  (2006.01)
*C23C 14/34*  (2006.01)
(Continued)

(52) U.S. Cl.
CPC .............. *C23C 14/50* (2013.01); *C23C 14/34* (2013.01); *H01J 37/32715* (2013.01); *H01L 21/68721* (2013.01)

(58) Field of Classification Search
CPC ......... H01J 37/32715; H01L 21/68721; C23C 14/50; C23C 16/458; C23C 14/34
See application file for complete search history.

(56) References Cited

U.S. PATENT DOCUMENTS 3,625,160 A * 12/1971 Bergman ............... A47B 27/06
                                                           108/2
2011/0020097 A1 * 1/2011 Franz ................... B65G 49/061
                                                     414/225.01

FOREIGN PATENT DOCUMENTS

| CN | 202107759 U | 1/2012 |
| CN | 203778100 U | 8/2014 |
| CN | 104261690 A | 1/2015 |

OTHER PUBLICATIONS

First Chinese Office Action dated Oct. 9, 2016 for corresponding Chinese Application No. 201510254289.4.

* cited by examiner

*Primary Examiner* — Michael A Band
(74) *Attorney, Agent, or Firm* — Kinney & Lange, P.A.

(57) ABSTRACT

The present disclosure provides a clamp and a carrier used in a coating apparatus. The clamp includes a fixed clamping piece and a movable clamping piece connected to the fixed clamping piece through a torsion spring. A guide groove in which a clamping backing plate is slidably mounted is provided on the movable clamping piece. A transmission mechanism is disposed on the movable clamping piece and is connected to the clamping backing plate. When a force is applied to the transmission mechanism to open the movable clamping piece, the transmission mechanism drives the clamping backing plate to retract into the guide groove, and when the force applied to the transmission mechanism is withdrawn, the movable clamping piece is closed under the action of the torsion spring such that the transmission mechanism drives the clamping backing plate to extend out of the guide groove and beyond the movable clamping piece.

10 Claims, 3 Drawing Sheets

(51) Int. Cl.
*H01J 37/32* (2006.01)
*H01L 21/687* (2006.01)

CLAMP AND CARRIER USED IN A COATING APPARATUS

CROSS-REFERENCE TO RELATED APPLICATIONS

This application claims the priority of Chinese Application No. CN201510254289.4, filed May 18, 2015, entitled "Clamp and Carrier Used in a Coating Apparatus", which is incorporated herein by reference in entirety.

FIELD OF THE DISCLOSURE

The present disclosure relates to a field of coating technology, and particularly to a clamp and a carrier used in a coating apparatus.

DESCRIPTION OF THE RELATED ART

Coated glass refers to coating one or more layers of films on a surface of a glass substrate such that the glass substrate has properties of such as heat reflectivity, low radiation and electrical conductivity. Currently, coated glass is usually produced by use of a coating apparatus. In particular, firstly, the glass substrate is placed on a carrier, and then the carrier is mounted on a conveying means. The glass substrate is conveyed to a sputtering chamber of the coating apparatus by means of the conveying means. The coating of the glass substrate is carried out within the sputtering chamber by magnetron sputtering. After the coating ends, the carrier and the glass substrate are removed out of the sputtering chamber by means of the conveying means, and then the coated glass substrate (coated glass) is removed from the carrier.

In order to increase the amount of coated glass per production batch, the carrier for glass substrate is vertically disposed on the conveying means, so that the glass substrate is uprightly disposed in the sputtering chamber. Therefore, in order to prevent the glass substrate from slipping from the carrier, a plurality of clamps for clamping the glass substrate is provided around the carrier, each clamp including a fixed clamping piece fixedly mounted on the carrier and a movable clamping piece, and a clamping backing plate is fixedly disposed on a clamping end of the movable clamping piece. The fixed clamping piece and the movable clamping piece are connected by a torsion spring with each other. When used, the clamp is opened by pressing a pressing end of the movable clamping piece, so as to receive the glass substrate. When the pressing force is withdrawn from the movable clamping piece, the clamp is closed under the action of a restoring force from the torsion spring, and the clamping backing plate clamps the edge of the glass substrate, thereby clamping the glass substrate on the carrier. After the coating ends, the carrier and the glass substrate are removed out of the sputtering chamber by means of the conveying means and then the pressing end of the movable clamping piece is pressed down such that the coated glass substrate can be removed from the carrier.

However, the inventor has found in practice that, during the process in which the glass substrate is mounted onto the carrier or removed from the carrier after being coated, it is prone for the edge of the glass substrate to fragment. The fragmentation mainly relates to two reasons. On one hand, when the clamp is closed after the glass substrate is placed on the carrier, if the restoring force of the torsion spring is too large, the closing speed of the clamp will be so fast that the clamping backing plate violently impacts the edge of the glass substrate, resulting in the fragmentation of the edge of the glass substrate. On the other hand, when the glass substrate is coated in the sputtering chamber, it is necessary to continually charge the sputtering chamber with gas and the glass substrate will violently shock under the impact from the gas charged into the sputtering chamber. However, the clamping location on the glass substrate is in a distance of about 1 cm from the edge of the glass substrate, which results in that part of the edge of the glass substrate detaches from the corresponding clamp and that part of the edge of the glass substrate moves from a position between the clamping backing plate and the fixed clamping piece to a position outside the clamping backing plate. An outwardly supporting force, which is applied to the edge of the glass substrate, is then formed when the clamp is opened during the process in which the glass substrate is removed from the carrier after being coated, causing the fragmentation of the edge of the glass substrate.

SUMMARY OF THE DISCLOSURE

An object of the present disclosure is to provide a clamp and a carrier used in a coating apparatus, for solving a problem that edge of a glass substrate is prone to fragment in the process of opening and closing the clamp.

To achieve the above object, the present disclosure provides the following technical solutions.

In one aspect, the present disclosure provides a clamp applicable in a carrier used in a coating apparatus, the clamp including a fixed clamping piece and a movable clamping piece, the movable clamping piece being connected to the fixed clamping piece through a torsion spring, wherein a guide groove is provided on the movable clamping piece; a clamping backing plate is slidably mounted in the guide groove; a transmission mechanism is disposed on the movable clamping piece, and the transmission mechanism is connected to the clamping backing plate, and wherein when a force is applied to the transmission mechanism to open the movable clamping piece, the transmission mechanism drives the clamping backing plate to retract into the guide groove, and when the force applied to the transmission mechanism is withdrawn, the movable clamping piece is closed under the action of the torsion spring such that the transmission mechanism drives the clamping backing plate to extend out of the guide groove and beyond the movable clamping piece.

In another aspect, the present disclosure also provides a carrier used in a coating apparatus, wherein the carrier includes the clamp described above.

In the clamp and the carrier used in a coating apparatus according to the present disclosure, the clamping backing plate is slidably mounted in the guide groove on the movable clamping piece, and the transmission mechanism drives the clamping backing plate to retract into the guide groove when a force is applied to the transmission mechanism to open the movable clamping piece; and the movable clamping piece is closed under the action of the torsion spring such that the transmission mechanism drives the clamping backing plate to extend out of the guide groove and beyond the movable clamping piece when the force applied to the transmission mechanism is withdrawn. Thus, when the movable clamping piece is closed under the action of the torsion spring after the glass substrate is placed on the carrier, the transmission mechanism drives the clamping backing plate to gradually extend out of the guide groove and beyond the movable clamping piece, such that the clamping backing plate is in slidable contact with the glass substrate, to prevent the clamping backing plate from violently impacting the edge of the glass substrate and thus the fragmentation of the edge of the glass substrate may be avoided. When the coated glass substrate is removed from the carrier, the transmission mechanism drives the clamping backing plate to retract into the guide groove while a force is applied to the transmission mechanism to open the movable clamping piece, to prevent the coated glass substrate from being supported outwardly when the movable clamping piece is opened, and thus the fragmentation of the edge of the glass substrate may be avoided.

In summary, the usage of the clamp and the carrier used in the coating apparatus according to the present disclosure may avoid the fragmentation of the edge of the glass substrate in the process of opening and closing the clamp.

BRIEF DESCRIPTION OF THE DRAWINGS

The drawings described here, which form part of the present disclosure, provide further understanding to the present disclosure. The exemplary embodiments of the present disclosure and the description thereof are intended to explain the present disclosure and are not intended to limit the present invention. In the drawings.

REFERENCE NUMBER

10—fixed clamping piece
20—movable clamping piece
21—strip-shaped opening
30—torsion spring
40—guide groove
41—stopping block
42—guide plate
50—clamping backing plate
51—stopper projection
52—stopping projection
60—transmission mechanism
61—connecting rod
62—pressing block
63—retractable spring
70—push rod
71—roller

DETAILED DESCRIPTION OF EMBODIMENTS

To further illustrate the clamp and the carrier used in the coating apparatus according to an embodiment of the present disclosure, they will be described in detail in conjunction with the accompanying drawings.

Figure 1:
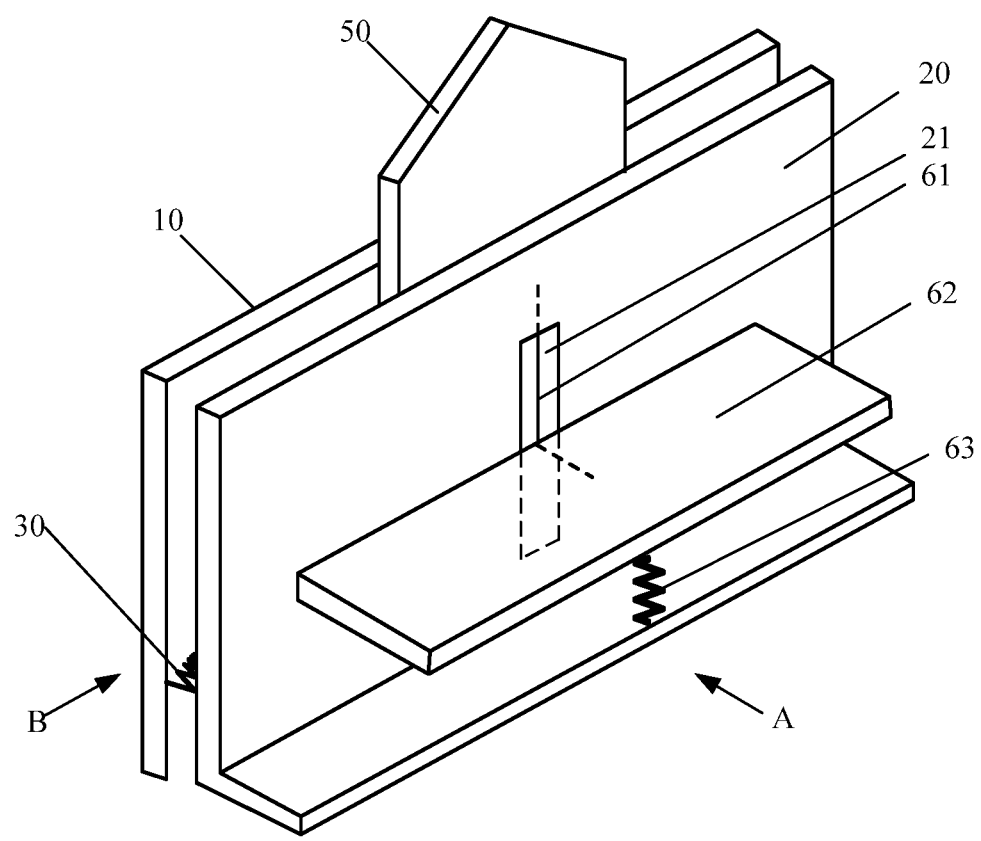
FIG. 1 is a schematic view of the structure of the clamp according to an embodiment of the present invention.
Figure 2:
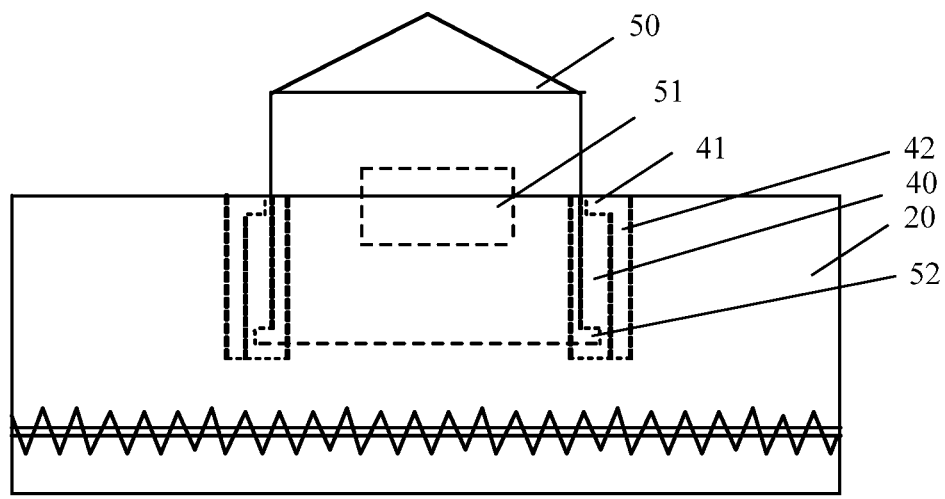
FIG. 2 is a view of FIG. 1 in direction A.
Figure 3:
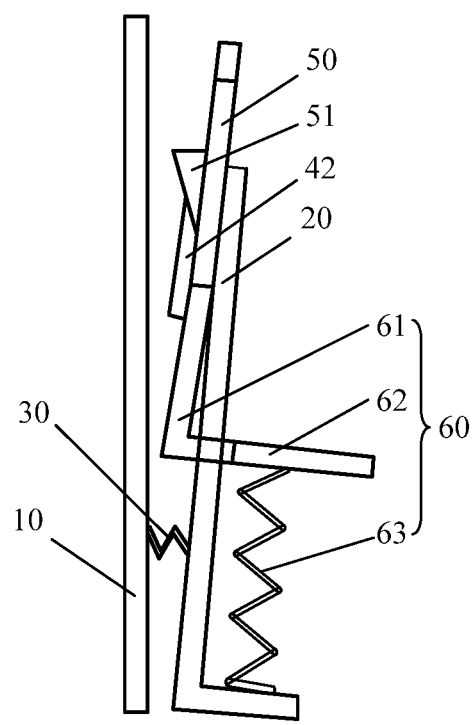
FIG. 3 is a view of FIG. 1 in direction B.

FIG. 1 is a schematic view of the structure of the clamp according to an embodiment of the disclosure. FIG. 2 is a view of FIG. 1 in direction A. In FIG. 2, a transmission mechanism 60 outside of a movable clamping piece 20 and a portion of the movable clamping piece that cooperates with the transmission mechanism 60 are omitted. FIG. 3 is a view of FIG. 1 in direction B.

Figure 5:
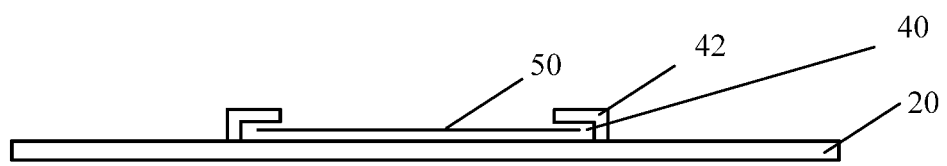
FIG. 5 is a schematic view of position relationship among a guide groove, a clamping backing plate and a movable clamping piece.

As shown in FIGS. 1, 2 and 3, the clamp according to an embodiment of the present invention includes a fixed clamping piece 10 and a movable clamping piece 20. The movable clamping piece 20 is connected to the fixed clamping piece 10 through a torsion spring 30. A guide groove 40 is provided on the movable clamping piece 20, as shown in FIGS. 2 and 5. A clamping backing plate 50 is slidably mounted in the guide groove 40. A transmission mechanism 60 is disposed on the movable clamping piece 20, and the transmission mechanism 60 is connected to the clamping backing plate 50. When a force is applied to the transmission mechanism 60 to open the movable clamping piece 20, the transmission mechanism 60 drives the clamping backing plate 50 to retract into the guide groove 40, and when the force applied to the transmission mechanism 60 is withdrawn, the movable clamping piece 20 is closed under the action of the torsion spring 30 such that the transmission mechanism 60 drives the clamping backing plate 50 to extend out of the guide groove 40 and beyond the movable clamping piece 20.

In the above embodiment, the connecting arrangement among the fixed clamping piece 10, the movable clamping piece 20 and the torsion spring 30 is similar to the connecting arrangement among the fixed clamping piece 10, the movable clamping piece 20 and the torsion spring 30 in the existing clamp and thus will not be described in detail herein. The guide groove 40 is provided on a surface of the movable clamping piece 20 facing the fixed clamping piece 10. The clamping backing plate 50 is mounted in the guide groove 40, and the transmission mechanism 60 may drive the clamping backing plate 50 to retract into the guide groove 40 or to extend out of the guide groove 40 and beyond the movable clamping piece 20. The guide groove 40 will be described in detail hereinafter with reference to FIG. 5.

When a carrier used in a coating apparatus employs the clamp described in the above embodiments, a plurality of clamps are usually provided around the carrier. When used, a force is applied to the transmission mechanism 60 on each of the movable clamping pieces 20 such that each of the movable clamping pieces 20 is opened and maintained, i.e., the transmission mechanism 60 drives the clamping backing plate 50 to retract into the guide groove 40 while each of the movable clamping pieces 20 is opened. The glass substrate to be coated is then placed on the carrier. The force applied to the transmission mechanism 60 is then withdrawn and each of the movable clamping pieces 20 is closed under the action of the corresponding torsion spring 30. That is to say, each movable clamping piece 20 is closed such that in the process of closing the clamp the transmission mechanism 60 drives the clamping backing plate 50 to extend out of the guide groove 40 and beyond the movable clamping piece 20 along the guide groove 40, causing the clamping backing plate 50 to be in slidable contact with the glass substrate, preventing the clamping backing plate 50 from violently impacting the edge of the glass substrate and thus avoiding the fragmentation of the edge of the glass substrate.

When the coated glass substrate is removed from the carrier, a force is applied to the transmission mechanism 60 to open and maintain the respective movable clamping pieces 20. The transmission mechanism 60 drives the clamping backing plate 50 to retract into the guide groove 40 while the movable clamping piece 20 is opened. Thus, even when a part of the edge of the coated glass substrate is moved from a position between the clamping backing plate 50 and the fixed clamping piece 10 to a position outside the clamping backing plate 50, because the clamping backing plate 50 will gradually retract into the guide groove 40 as the movable clamping piece 20 opens, the edge of the coated glass substrate will not be outwardly supported by the clamping backing plate 50 when the clamp is opened, avoiding the fragmentation of the edge of the glass substrate.

In summary, with the clamp according to the embodiment of the present invention, when a glass substrate to be coated is placed on the carrier, the clamping backing plate 50 will not impact the edge of the glass substrate in the process of closing the clamp; and when the coated glass substrate is removed from the carrier, the edge of the coated glass substrate outside the clamping backing plate 50 will not be outwardly supported by the clamping backing plate 50. Therefore, with the clamp according to the embodiment of the present invention, the opening process or the closing process of the clamp will not cause the fragments of the edge of the glass substrate.

It is the clamping backing plate 50 and the fixed clamping piece 10 that clamp and fix the glass substrate in the above clamp. In order to avoid shading the effective coating area of the glass substrate, it may be necessary to restrain the length over which the clamping backing plate 50 extends out of the guide groove 40 and beyond the movable clamping piece 20, or to restrain an extent by which the clamping backing plate 50 is capable of clamping the edge of the glass substrate, that is, to restrain the clamping extent by which the clamping backing plate 50 is capable of clamping the edge of the glass substrate. Referring to FIG. 3, in the present embodiment, a stopper projection 51 is provided on a side of the clamping backing plate 50 that faces the fixed clamping piece 10. The stopper projection 51 defines a clamping extent by which the clamping backing plate 50 is capable of clamping the edge of the glass substrate. When the clamp according to the embodiment of the present invention is used to clamp the glass substrate, the force applied to the transmission mechanism 60 will be removed after the glass substrate to be coated is placed on the carrier. Then, the clamp is closed under the action of the torsion spring 30 such that the transmission mechanism 60 drives the clamping backing plate 50 to gradually extend out of the guide groove 40 and beyond the movable clamping piece 20 along the guide groove 40. When the stopper projection 51 is in contact with the edge of the glass substrate and presses against the edge, the clamping backing plate 50 stops extending out of the guide groove 40 under the interaction between the stopper projection 51 and the edge of the glass substrate. Therefore, the clamping extent by which the clamping backing plate 50 is capable of clamping the edge of the glass substrate can be restrained, preventing the clamping backing plate 50 from covering the effective coating area of the glass substrate and from affecting the coating effect due to too large clamping extent by which the clamping backing plate 50 is capable of clamping the edge of the glass substrate.

In addition, by providing the stopper projection 51 on the side of the clamping backing plate 50 that faces the fixed clamping piece 10, in the process of coating the glass substrate in the sputtering chamber and charging the sputtering chamber with gas, the glass substrate can be prevented from vibrating. The vibration of the glass substrate may cause some parts of the edge of the glass substrate to deviate from the movable clamping piece 20 and the clamping backing plate 50, causing the glass substrate to slide and the effective coating area on the glass substrate to deviate.

A portion of the clamping backing plate 50 in the above clamp that extends out of the guide groove 40 and beyond the clamping end of the movable clamping piece 20 may be in various forms, such as a rectangular backing plate, a trapezoidal backing plate, an arc-shaped backing plate or a triangular backing plate. In the clamp in the embodiment of the present invention, as shown in FIG. 1 or 2, the portion of the clamping backing plate 50 that extends out of the guide groove 40 and beyond the clamping end of the movable clamping piece 20 is triangular.

In the embodiment of the present invention, the movable clamping piece 20 in the clamp is a titanium aluminum alloy plate and the clamping backing plate 50 is a polyether ether ketone (PEEK) plate. Since the titanium aluminum alloy has a high melting point, a high hardness and a good chemical stability, the movable clamping piece 20 of titanium aluminum alloy will not be prone to deform under high temperature environment in the sputtering chamber when a glass substrate is coated in the sputtering chamber, thereby obtaining a good reliability of the clamp holding the glass substrate. Since PEEK has a good heat resistance and a good chemical stability, the clamping backing plate 50 of PEEK will not be prone to deform under high temperature environment in the sputtering chamber when a glass substrate is coated in the sputtering chamber. In addition, when the clamping backing plate 50 extends out of the guide groove 40 and beyond the movable clamping piece 20 so as to clamp the glass substrate, or when the clamping backing plate 50 retracts into movable clamping piece 20 to release the glass substrate, the surface of the clamping backing plate 50 will slide relative to the surface of the edge the glass substrate. Since PEEK has a self-lubricating property, the friction coefficient between the surface of the clamping backing plate 50 and the surface of the edge of the glass substrate is low, thereby avoiding the wear of the glass substrate when the clamping backing plate 50 comes into sliding contact with the surface of the edge of the glass substrate.

In the process of the clamping backing plate 50 extending out of the guide groove 40 and beyond the movable clamping piece 20 or in the process of the clamping backing plate 50 retracting into the guide groove 40, in order to prevent the clamping backing plate 50 from being driven by the drive transmission mechanism 60 to be detached from the guide groove 40, a stopping block 41 that can prevent the clamping backing plate 50 from being detached out of the guide groove 40, as shown in FIG. 2, is provided in the guide groove 40 in the clamp. Referring to FIG. 2, when the clamping backing plate 50 slides to one end of the guide groove 40, for example, the upper or lower end of the guide groove 40 as shown in FIG. 2, the stopping block 41 provided in the guide groove 40 can prevent the clamping backing plate 50 from being detached out of the guide groove 40 so as to improve the reliability of the clamp holding the glass substrate. Accordingly, a stopping projection 52 that cooperates with the stopping block 41 is provided on the clamping backing plate 50. The stopping projection 52 may be a portion of the lower end of the clamping backing plate 50 that extends outwardly towards two sides. It is noted that the stopping block 41 is not necessary. And FIG. 2 only shows the case in which the stopping block 41 is provided on the upper end of the guide groove 40. A person skilled in the art may conceive of further providing another stopping block 41 on the lower end of the guide groove 40, to prevent the clamping backing plate 50 being detached from the lower end of the guide groove 40.

In the above-described clamp, the transmission mechanism 60 is arranged to drive the clamping backing plate 50 to extend out of the guide groove 40 and beyond the movable clamping piece 20 or to retract into the guide groove 40, to achieve the holding and releasing of the glass substrate. In the embodiment of the present invention, still referring to FIG. 3, the transmission mechanism 60 includes a connecting rod 61, a pressing block 62 and a retractable spring 63, wherein one end of the connecting rod 61 passes through a strip-shaped opening 21 formed in the movable clamping piece 20 and is connected to the clamping backing plate 50. The other end of the connecting rod 61 is connected to the pressing block 62. One end of the retractable spring 63 is connected to a pressing end of the movable clamping piece 20, and the other end of the retractable spring 63 is connected to the pressing block 62. When the clamping backing plate 50 is required to retract into the guide groove 40, a force is applied to the pressing block 62 such that the pressing block 62 moves toward the pressing end of the movable clamping piece 20. The pressing block 62 then drives the connecting rod 61 to move away from the clamping end of the movable clamping piece 20 such that the clamping backing plate 50 slides into the movable clamping piece 20 along the guide groove 40 and such that the clamping backing plate 50 retracts into the guide groove 40. At the same time, the retractable spring 63 is compressed under the action of the pressing block 62. When the clamping backing plate 50 is required to extend out of the guide groove 40 and beyond the movable clamping piece 20, the force applied to the pressing block 62 is withdrawn and the retractable spring 63 restores. The pressing block 62 moves away from the pressing end of the movable clamping piece 20 and drives the connecting rod 61 to move toward the clamping end of the movable clamping piece 20 such that the clamping backing plate 50 slides towards outside of the movable clamping piece 20 along the guide groove 40 and such that the clamping backing plate 50 extending out of the guide groove and beyond the movable clamping piece.

It is noted that in the case that the strip-shaped opening 21 is formed in the movable clamping piece 20, the length of the strip-shaped opening 21 can be set according to the extension over which the clamping backing plate 50 slides within the guide groove 40 to restrain the extension in which the connecting rod 61 moves towards or away from the clamping end of the movable clamping piece 20. By restraining the moving extension of the connecting rod 60, the extension over which the clamping backing plate 50 extending out of the guide groove 40 and beyond the movable clamping piece 20 is restrained so as to further restrain the clamping extent by which the clamping backing plate 50 is capable of clamping the edge the glass substrate, preventing the sputtering effect from being affected due to the too large clamping extent by which the clamping backing plate 50 is capable of clamping the edge of the glass substrate.

The connecting rod 61 in the above clamp may have a variety of shapes. For example, the connecting rod 61 may be an inverted T-shaped connecting rod, which includes a longitudinal section and a transverse section. The longitudinal section of the inverted T-shaped connecting rod is located between the movable clamping piece 20 and the fixed clamping piece 10 and is connected to the clamping backing plate 50. One end of the transverse section of the inverted T-shaped connecting rod passes through the strip-shaped opening 21 in the movable clamping piece 20 and is connected to the pressing block 62.

In the clamp provided by the embodiment of the present invention, still referring to FIG. 3, the connecting rod 61 is an L-shaped connecting rod. A longitudinal section of the L-shaped connecting rod is connected to the clamping backing plate 50 and a transverse section of the L-shaped connecting rod 61 is connected to the pressing block 62. In particular, the longitudinal section of the L-shaped connecting rod is located between the movable clamping piece 20 and the fixed clamping piece 10 and an end of the longitudinal section that is away from the connection to the transverse section is connected to the clamping backing plate 50. One end of the transverse section of the L-shaped connecting rod that is away from the connection to the longitudinal section passes through the strip-shaped opening 21 in the movable clamping piece 20 and is connected to the pressing block 62. In the case that the connecting rod 61 is provided to be an L-shaped connecting rod, the interference between the fixed clamping piece 10 and the end of the transverse section of the inverted T-shaped connecting rod that is located between the movable clamping piece 20 and the fixed clamping piece 10 can be prevented.

In general, there are a plurality of clamps that are provided on the carrier. When the glass substrate is clamped onto the carrier or removed from the carrier utilizing the plurality of clamps, in order to avoid multiple operations one by one that may affect the productivity, the plurality of clamps are usually operated synchronously. For example, referring to FIG. 4, in the embodiment of the present invention, each clamp further includes a push rod 70 cooperating with the transmission mechanism 60. In particular, a force applying means applies a force to the push rod 70 of each of the clamps at the same time and the push rod 70 then drives the transmission mechanism 60, such that the plurality of clamps on the carrier are opened or closed at the same time. Therefore, the operations of various clamps can be carried out synchronously, preventing the edge of the glass substrate from deforming or fragmenting, which may be caused by the uneven stress on the edge of glass substrate due to the unsynchronized operation on the various clamps, and improving the productivity.

Figure 4:
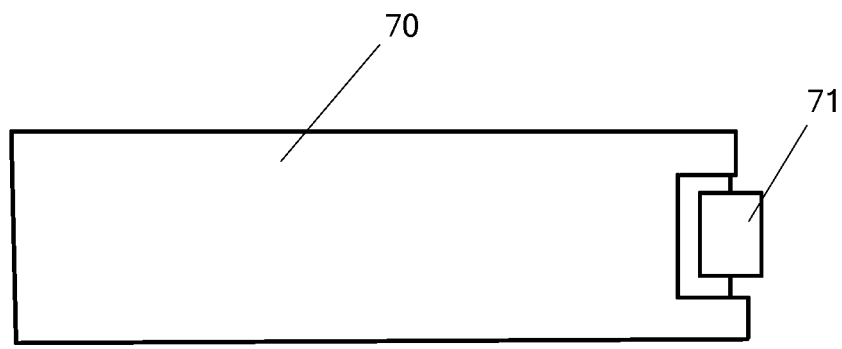
FIG. 4 is a schematic view of structure of a push rod in the embodiment of the present invention.

In the clamp provided in the embodiment of the present invention, referring to FIG. 4, a roller 71 is provided at an end of the push rod 70. The force applying means pushes the push rod 70, the roller 71 comes into contact with the pressing block 62 and applies an external force to the pressing block 62, such that the clamping backing plate 50 extends out of the guide groove 40 and beyond the movable clamping piece 20 or retracts into the guide groove 40 and such that the clamps are opened or closed at the same time, to achieve the holding or releasing of the glass substrate. While the roller 71 comes into contact with the pressing block 62 and applies an external force to the pressing block 62, the roller 71 rolls on the upper surface of the pressing block 62 shown in FIG. 1, so that the roller 71 is in rolling contact with the surface of the pressing block 62, thereby effectively preventing the wear of the surface of the pressing block 62 and prolonging the life of the clamp. Of course, in order to further protect the surface of the pressing block 62, a soft medium, such as cotton, may be wrapped around the outer circumferential surface of the roller 71.

FIG. 5 is a schematic view of position relationship among the guide groove 40, the clamping backing plate 50 and the movable clamping piece 20. As shown in FIGS. 2, 3 and 5, the guide groove 40 may be formed by a space between two L-shaped guide plates 42 and the movable clamping piece 20, the L-shaped guide plates 42 having L-shaped cross-sections, wherein the two guide plates 42 are provided on a surface of the movable clamping piece 20 that faces the fixed clamping piece 10 and the two guide plates 42 are symmetrically located on two sides of the clamping backing plate 50 after being assembled. It can be appreciated by those skilled in the art that the guide plate 42 may also be substantially U-shaped and that two opposed U-shaped portions of the guide plates 42 constitute the guide groove 40 for the clamping backing plate 50.

An embodiment of the present invention further provides a carrier used in a coating apparatus, which includes the clamp described in any one of the above embodiments.

The carrier has same advantages with respect to the prior art as the clamp described above, which will not be described here.

In the above description with respect to the embodiments, the particular features, structures, materials, or characteristics in any of the embodiments or examples may be combined with those in other embodiments or examples in any suitable manner.

The above embodiments are provided only by way of examples, and the scope of the present application is not limited thereto. On the basis of the present disclosure, any person skilled in the art can easily conceive of any modification or equivalent that will fall within the protection scope of the present application. Accordingly, the protection scope of the application should only be limited by the appended claims.

What is claimed is:

1. A clamp applicable in a carrier used in a coating apparatus, the clamp comprising a fixed clamping piece and a movable clamping piece, the movable clamping piece being connected to the fixed clamping piece through a torsion spring,
   wherein a guide groove configured to guide a clamping back plate is provided on the movable clamping piece; the clamping backing plate is configured to contact and clamp a glass substrate to be coated and to be slidably mounted in the guide groove; a transmission mechanism is disposed on the movable clamping piece, and the transmission mechanism is directly connected to the clamping backing plate,
   wherein when a force is applied to the transmission mechanism to open the movable clamping piece, the transmission mechanism is configured to drive the clamping backing plate to retract into the guide groove, and when the force applied to the transmission mechanism is withdrawn and the movable clamping piece is closed under the action of the torsion spring, the transmission mechanism is configured to drive the clamping backing plate slide along the guide groove and parallel to the movable clamping piece and to extend beyond the movable clamping piece in a sliding direction,
   wherein a stopper projection is provided on a side of the clamping backing plate that faces the fixed clamping piece, and wherein the stopper projection defines a clamping extent by which the clamping backing plate is configured to clamp an edge of the glass substrate,
   wherein the transmission mechanism comprises a connecting rod, a pressing block and a retractable spring,
   wherein a first end of the connecting rod passes through a strip-shaped opening formed in the movable clamping piece and is directly connected to the clamping backing plate, and a second end of the connecting rod is directly connected to the pressing block; and
   wherein a first end of the retractable spring is directly connected to a pressing end of the movable clamping piece, and a second end of the retractable spring is directly connected to the pressing block.

2. The clamp according to claim 1, wherein a portion of the clamping backing plate that extends out of the guide groove and beyond a clamping end of the movable clamping piece is triangular.

3. The clamp according to claim 1, wherein the movable clamping piece is a titanium aluminum alloy plate, and wherein the clamping backing plate is a polyether ether ketone plate.

4. The clamp according to claim 1, wherein a stopping block that prevents the clamping backing plate from being detached out of the guide groove is provided in the guide groove.

5. The clamp according to claim 1, wherein the connecting rod is an L-shaped connecting rod, and wherein a longitudinal section of the L-shaped connecting rod is connected to the clamping backing plate and a transverse section of the L-shaped connecting rod is connected to the pressing block.

6. The clamp according to claim 1, wherein the clamp further comprises a push rod cooperating with the transmission mechanism.

7. The clamp according to claim 6, wherein a roller is provided at an end of the push rod.

8. A carrier for use in a coating apparatus, wherein the carrier comprises the clamp according to claim 1.

9. The clamp according to claim 2, wherein the movable clamping piece is a titanium aluminum alloy plate, and wherein the clamping backing plate is a polyether ether ketone plate.

10. The clamp according to claim 5, wherein the clamp further comprises a push rod cooperating with the transmission mechanism.

\* \* \* \* \*